US008278565B2

United States Patent
Honjo et al.

(10) Patent No.: US 8,278,565 B2
(45) Date of Patent: Oct. 2, 2012

(54) THREE-DIMENSIONAL WIRING BOARD

(75) Inventors: Kazuhiko Honjo, Osaka (JP); Tadashi Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 265 days.

(21) Appl. No.: 12/808,107

(22) PCT Filed: Jan. 16, 2009

(86) PCT No.: PCT/JP2009/000138
§ 371 (c)(1),
(2), (4) Date: Jun. 14, 2010

(87) PCT Pub. No.: WO2009/090879
PCT Pub. Date: Jul. 23, 2009

(65) Prior Publication Data
US 2010/0288540 A1    Nov. 18, 2010

(30) Foreign Application Priority Data

Jan. 18, 2008 (JP) ................................. 2008-008860
Mar. 31, 2008 (JP) ................................. 2008-091100

(51) Int. Cl.
*H05K 1/11* (2006.01)
(52) U.S. Cl. ........................................ 174/262; 174/261
(58) Field of Classification Search .......... 174/261–266; 361/761–764, 792–795
See application file for complete search history.

(56) References Cited

U.S. PATENT DOCUMENTS 3,243,498 A * 3/1966 Allen et al. .................. 174/266
4,737,208 A    4/1988 Bloechle et al.
(Continued)

FOREIGN PATENT DOCUMENTS

JP    63-90158    4/1988
(Continued)

OTHER PUBLICATIONS

Japanese Office Action, and English translation thereof, issued in Japanese Patent Application No. 2008-008860 dated Jun. 5, 2012.

(Continued)

*Primary Examiner* — Jeremy Norris
(74) *Attorney, Agent, or Firm* — McDermott Will & Emery LLP

(57) ABSTRACT

A three-dimensional circuit board includes a lower substrate, a connection layer provided on an upper surface of the lower substrate, and an upper substrate provided on an upper surface of the connection layer. The connection layer exposes a portion of the upper surface of the lower substrate. The connection layer includes an insulating layer having a through-hole, and a via-conductor made of conductive material filling the through-hole. A recess is provided directly above the portion of the upper surface of the lower substrate and is surrounded by a side surface of the upper substrate and a side surface of the connection layer. A portion of the upper surface of the connection layer connected to the side surface of the connection layer inclines in a direction toward the portion of the upper surface of the lower substrate. The portion of the upper surface of the connection layer is provided from the side surface of the connection layer to the via-conductor. A portion of an upper substrate of the upper substrate connected to the side surface of the upper substrate inclines in a direction toward the portion of the upper surface of the lower substrate. The circuit board allows a component to be mounted in the recess efficiently.

13 Claims, 18 Drawing Sheets

U.S. PATENT DOCUMENTS 5,401,911 A * 3/1995 Anderson et al. ............. 174/262

FOREIGN PATENT DOCUMENTS

| JP | 63-114239 | 5/1988 |
| JP | 2007-194516 | 8/2007 |
| JP | 2007-266195 | 10/2007 |

OTHER PUBLICATIONS

Japanese Office Action, and English translation thereof, issued in Japanese Patent Application No. 2008-091100 dated Jun. 5, 2012.

* cited by examiner

THREE-DIMENSIONAL WIRING BOARD

RELATED APPLICATIONS

This application is the U.S. National Phase under 35 U.S.C. §371 of International Application No. PCT/JP2009/000138, filed on Jan. 16, 2009, which in turn claims the benefit of Japanese Application Nos. 2008-008860, filed on Jan. 18, 2008 and 2008-091100, filed on Mar. 31, 2008, the disclosures of which Applications are incorporated by reference herein.

TECHNICAL FIELD

The present invention relates to a three-dimensional circuit board which is widely used for an electronic device, such as a personal computer, a mobile phone, and a video camera.

BACKGROUND ART

Mobile devices, such as personal computers, digital cameras, and mobile phones, have been recently used widely, and have been demanded to have a small size, a low profile, a light weight, high resolution, and multiple functions. Semiconductor elements used for such devices accordingly have had a small package and are mounted in a three-dimensional structure. In order to provide the semiconductor devices with a small size in a three-dimensional structure, a board having a cavity, i.e., a recess therein is used.

FIGS. 15A and 15B are sectional views conventional circuit board 127 with a cavity described in Patent Document 1 for illustrating a method of manufacturing the circuit board.

As shown in FIG. 15A, upper substrate 123, connection layer 121, and lower substrate 122 are stacked such that connection layer 121 is located between lower substrate 122 and upper substrate 123 while electrodes and openings are aligned, thereby providing circuit board 127. After that, sheet 126 is placed on upper substrate 123. Sheet 126 includes removable layer 124 and thermoplastic resin layer 125 provided on removable layer 124. Thermoplastic resin layer 125 is fluidized with heat.

As shown in FIG. 15B, sheet 126 is heated and pressure-bonded onto upper substrate 123. Heat and pressure applied to sheet 127 fluidize thermoplastic resin layer 125 of sheet 126 to fill recess 128 and prevent connection layer 121 from moving into recess 128. Therefore, upper substrate 123, connection layer 121, and lower substrate 122 are stacked before connection layer 121 moves. After that, sheet 126 is peeled off, thus providing circuit board 127.

In circuit board 127, edge 129 of upper substrate 123 constituting an edge of recess 128 has a nearly right angle, which prevents components to from being mounted around the edge of recess 128 easily. Besides, removable layer 124 can be easily broken due to the right-angled edge 129. Upon sheet 126 being removed, removable layer 124 cannot be completely removed from recess 128 and edge 129.

As shown in FIG. 15B, sheet 126 pressure-bonded onto circuit board 127 deforms to have a shape identical to the shape of recess 128. Sheet 126 is removed from circuit board 127 with its shape maintained, hence being prevented from being removed when recess 128 is deep.

FIG. 16 is a sectional view of another conventional circuit board 501 manufactured in a manner similar to that of circuit board 127 shown in FIGS. 15A and 15B. FIG. 17 is a sectional view of circuit board 501 for illustrating a method of manufacturing circuit board 501. In FIGS. 16 and 17, components identical to those of circuit board 127 shown in FIGS. 15A and 15B are denoted by the same reference numerals, and their description will be omitted. In circuit board 501 shown in FIG. 16, edge 129 of upper substrate 123 constituting an edge of recess 128 has a nearly right angle. If mask 130 is placed in recess 128 for printing solder on land 128A on a bottom of recess 128, mask 130 easily contact edge 129 of upper substrate 123 as shown in FIG. 17. This contact often causes damage to mask 130 when mask 130 is placed in recess 128 or is removed from recess 128. In particular, if mask 310 is not aligned to land 128A accurately, mask 130 often contacts the edge of recess 128 and provides the edge with damage. Further, this nay prevents mask 130 from being placed easily in recess 128.

Patent Document 1: JP 63-90158A

SUMMARY OF THE INVENTION

A three-dimensional circuit board includes a lower substrate, a connection layer provided on an upper surface of the lower substrate, and an upper substrate provided on an upper surface of the connection layer. The connection layer exposes a portion of the upper surface of the lower substrate. The connection layer includes an insulating layer having a through-hole, and a via-conductor made of conductive material filling the through-hole. A recess is provided directly above the portion of the upper surface of the lower substrate and is surrounded by a side surface of the upper substrate and a side surface of the connection layer. A portion of the upper surface of the connection layer connected to the side surface of the connection layer inclines in a direction toward the portion of the upper surface of the lower substrate. The portion of the upper surface of the connection layer is provided from the side surface of the connection layer to the via-conductor. A portion of an upper substrate of the upper substrate connected to the side surface of the upper substrate inclines in a direction toward the portion of the upper surface of the lower substrate.

The circuit board allows a component to be mounted in the recess efficiently.

REFERENCE MARKS IN THE DRAWINGS

101 Upper Substrate
102 Lower Substrate
103 Connection Layer
103D Thermoplastic Resin
103E Inorganic Filler
104 Recess
105 Component
106 Conductive Paste
107 Via-Conductor (First Via-Conductor, Second Via-Conductor)
107A Via-Conductor (First Via-Conductor)
109 Through-Hole (First Through-Hole, Second Through-Hole)
111 Insulating Coat
201 Upper Substrate
202 Lower Substrate
203 Connection Layer
203D Thermoplastic Resin
203E Inorganic Filler
204 Recess
205 Component
206 Conductive Paste
207 Via-Conductor (First Via-Conductor, Second Via-Conductor)
207A Via-Conductor (First Via-Conductor)
209 Through-Hole (First Through-Hole, Second Through-Hole)

DETAILED DESCRIPTION OF THE PREFERRED EMBODIMENTS

Exemplary Embodiment 1

Figure 1A:
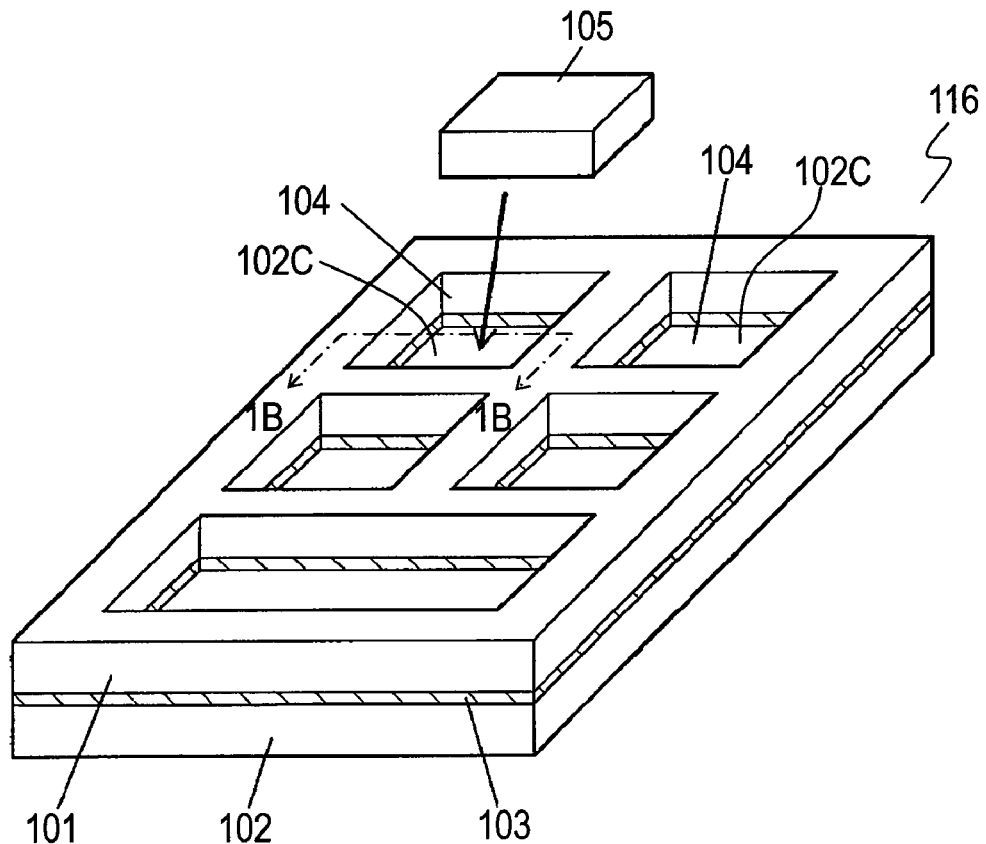
FIG. 1A is a perspective view of a three-dimensional circuit board in accordance with Exemplary Embodiment 1 of the present invention.
Figure 1B:
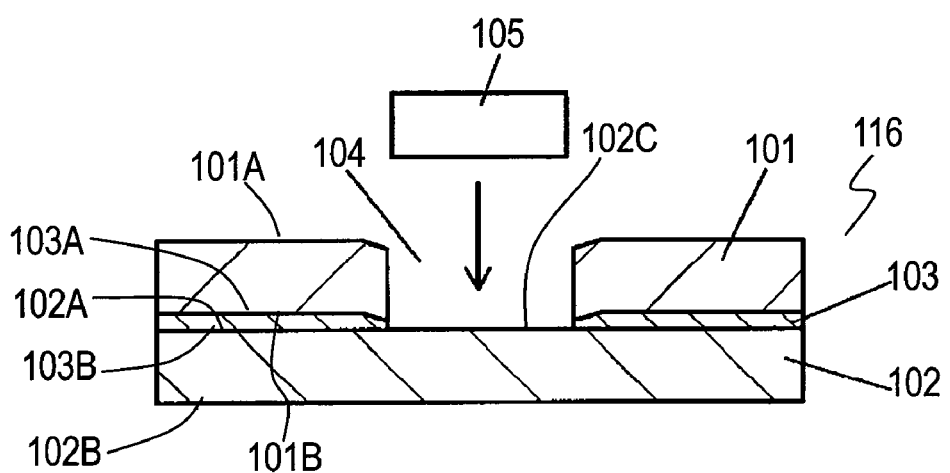
FIG. 1B is a sectional view of the circuit board at line 1B-1B shown in FIG. 1A.

FIG. 1A is a perspective view of circuit board 116 in accordance with Exemplary Embodiment 1 of the present invention. FIG. 1B is a sectional view of circuit board 116 on line 1B-1B shown in FIG. 1A. Circuit board 116 includes lower substrate 102, connection layer 103 provided on upper surface 102A of lower substrate 102, and upper substrate 101 provided on upper surface 103A of connection layer 103. Upper substrate 101 and lower substrate 102 are different in shape. Connection layer 103 has a thickness ranging from of 30 µm to 300 µm. Connection layer 103 is provided on upper surface 102A of lower substrate 102 to expose portion 102C of upper surface 102A. That is, recess 104 is surrounded by connection layer 103 and upper substrate 101 and directly above portion 102C of upper surface 102A of lower substrate 102. Wirings are formed on upper surface 101A and lower surface 101B of upper substrate 101 and on upper surface 102A and lower surface 102B of lower substrate 102. Component 105 is accommodated in recess 104 and mounted on circuit board 116. The structure reduces a total thickness of circuit board 116 having component 105 mounted thereto.

Figure 1C:
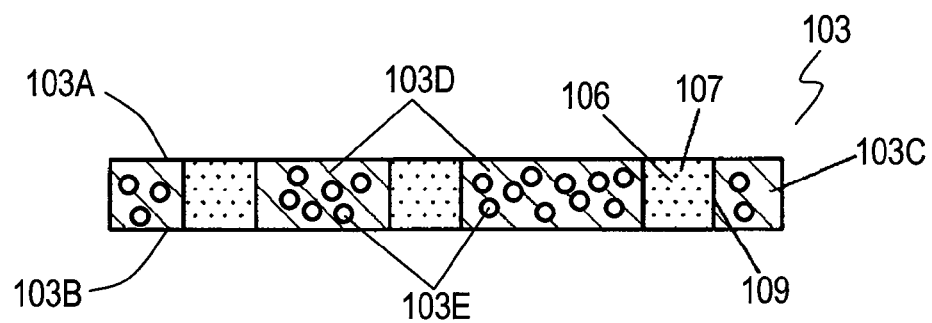
FIG. 1C is a sectional view of a connection layer of the circuit board in accordance with Embodiment 1.

FIG. 1C is a sectional view of connection layer 103. Connection layer 103 includes insulating layer 103C having upper surface 103A and lower surface 103B, and via-conductor 107 provided in insulating layer 103C. Insulating layer 103C has through-hole 109 communicating with upper surface 103A and lower surface 103B. Through-hole 109 is filled with conductive paste 106 made of conductive material, thereby providing via-conductor 107. Insulating layer 103C includes thermoplastic resin 103D, such as an epoxy resin, and inorganic filler 103E dispersed in thermoplastic resin 103D. Connection layer 103 is made of substantially uniform material from the upper surface 103A to lower surface 103B, thus containing no core material made of woven fabric, unwoven fabric, or film. Connection layer 103, upon having a thickness smaller than 30 μm, prevents the wirings from being embedded in connection layer 103. Connection layer 103, upon having a thickness larger than 300 μm requires via-conductor 107 to have a small diameter to maintain the aspect ratio of via-conductor 107, and accordingly, prevents the via conductor from being formed easily, hence deteriorating its connection reliability.

Inorganic filler 103E is preferably made of at least any one of silica, alumina, and barium titanate. Inorganic filler 103E has a particle diameter ranging preferably from 1 μm to 15 μm. Insulating layer 103C preferably contains 70 wt % to 90 wt % of inorganic filler 103E. The content of inorganic filler 103E smaller than 70 wt % may cause inorganic filler 103E to move according to the flow of thermoplastic resin 103D during the press process of thermoplastic resin 103D. The content of inorganic filler 103E exceeding 90 wt % prevents the wirings from being embedded in insulating layer 103C, thus preventing insulating layer 103C from adhering to substrates 101 and 102.

Conductive paste 106 is made preferably of any one of copper, silver, gold, palladium, bismuth, tin, and alloy thereof. The particle diameter of conductive paste 106 ranges preferably from 1 μm to 20 μm.

Figure 2:
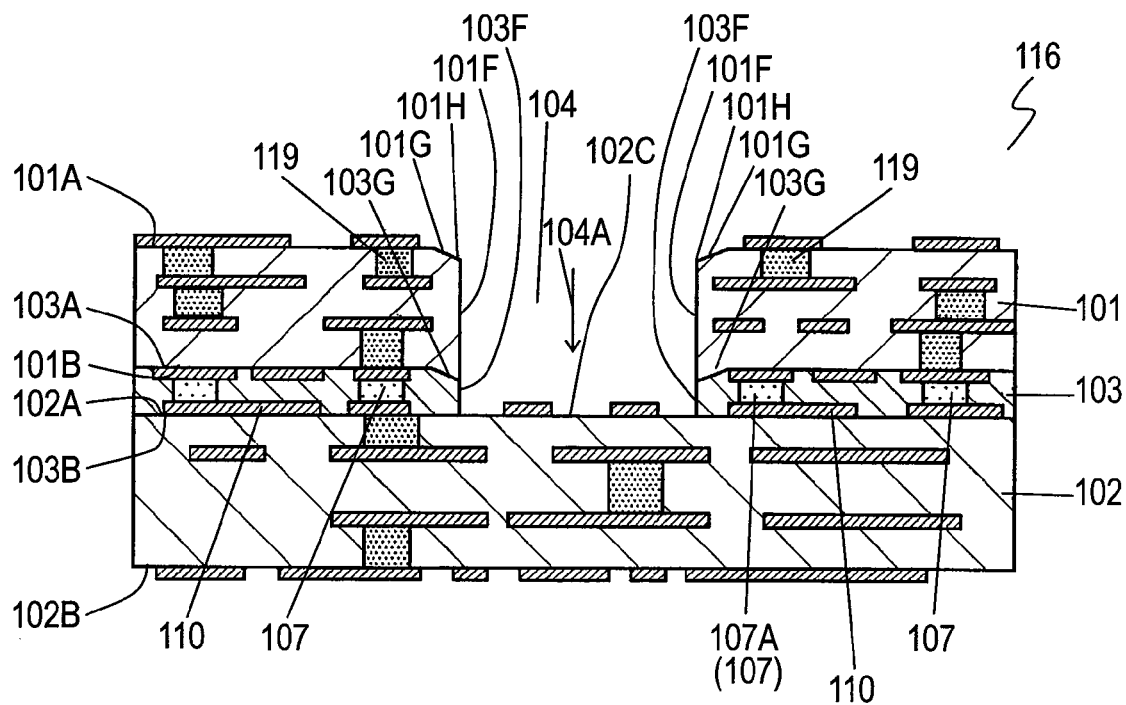
FIG. 2 is a sectional view of the circuit board in accordance with Embodiment 1.

FIG. 2 is a sectional view of circuit board 116. Recess 104 is surrounded by portion 102C of upper surface 102A of lower substrate 102, side surface 103F of connection layer 103, and side surface 101F of upper substrate 101. In other words, portion 102C of upper surface 102A of lower substrate 102, side surface 103F of connection layer 103, and side surface 101F of upper substrate 101 face recess 104. Portion 103G of upper surface 103A connected to side surface 103F downwardly inclines toward recess 104, that is, inclines in direction 104A toward both recess 104 and portion 102C of upper surface 102A of lower substrate 102. That is, portion 101G of upper surface 101A connected to side surface 101F of upper substrate 101 provided on upper surface 103A of connection layer 103 downwardly inclines toward recess 104, that is, inclines indirection 104A toward portion 102C of upper surface 102A of lower substrate 102. This structure allows upper surface 101A of upper substrate 101 to be connected to side surface 101F at edge 101H with an obtuse angle. Upper substrate 101 has a constant thickness throughout upper surface 101A including inclining portion 101G. That is, portion 101G of upper surface 101A of upper substrate 101 is parallel to portion 103G of upper surface 103A of connection layer 103. Portion 101G of upper surface 101A and portion 103G of upper surface 103A have a flat shape.

The total thickness of upper substrate 101 and connection layer 103, i.e., the depth defined by side surfaces 101F and 103F is smaller than the height of component 105 mounted in recess 104. This structure allows component 105 and a tool used for mounting to be easily inserted in the recess, hence allowing component 105 to be mounted efficiently. The length of portion 101G of upper surface 101A of upper substrate 101 and the length of portion 103G of upper surface 103A of connection layer 103 in a direction perpendicular to side surfaces 101F and 103F are larger than a chucking clearance of a tool used for mounting. Specifically, the lengths are determined to be not larger than 1.0 mm, more preferably, not larger than 0.3 mm.

If a via-conductor is formed in portion 101G of upper surface 101A or portion 103G of upper surface 103A, the via-conductor may not be positioned properly due to the inclined surface. To avoid this, portion 101G and portion 103G is formed between the edge of recess 104 and the via-conductor closest to the edge. Plural holes provided in upper substrate 101 are filled with conductive paste so as to form plural via-conductors 119. Via-conductor 107A out of via-conductors 107 and 119 is the closest to recess 104, i.e., side surfaces 103F and 101F. Each of inclining portion 101G of upper surface 101A and inclining portion 103G of upper surface 103 is formed between side surfaces 101F and 103F and via-conductor 107A, respectively. That is, no via-conductor is formed in portion 101G of upper surface 101A of upper substrate 101 and in portion 103G of upper surface 103A of connection layer 103.

A method for manufacturing circuit board 116 according to Embodiment 1 will be described below. FIGS. 3A to 3F, 4A to 4C, and 5A to 5C are sectional views of circuit board 116 for illustrating processes for manufacturing circuit board 116.

Figure 3A:
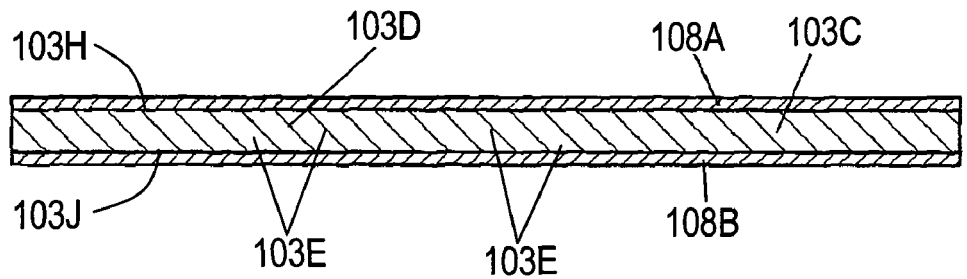
FIG. 3A is a sectional view of the circuit board in accordance with Embodiment 1 for illustrating a method of manufacturing the circuit board.
Figure 3B:
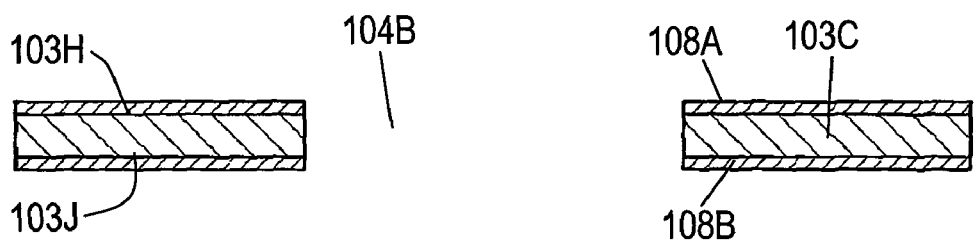
FIG. 3B is a sectional view of the circuit board in accordance with Embodiment 1 for illustrating the method of manufacturing the circuit board.
Figure 3C:
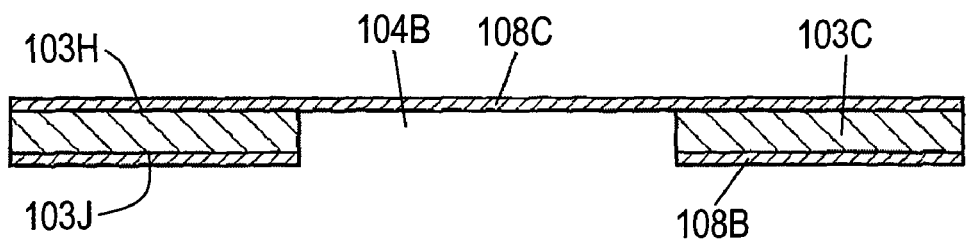
FIG. 3C is a sectional view of the circuit board in accordance with Embodiment 1 for illustrating the method of manufacturing the circuit board.
Figure 3D:
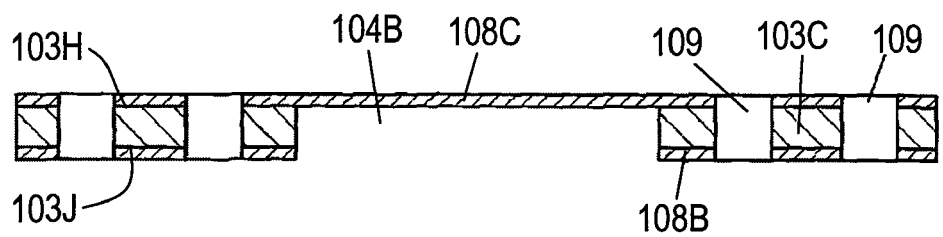
FIG. 3D is a sectional view of the circuit board in accordance with Embodiment 1 for illustrating the method of manufacturing the circuit board.
Figure 3E:
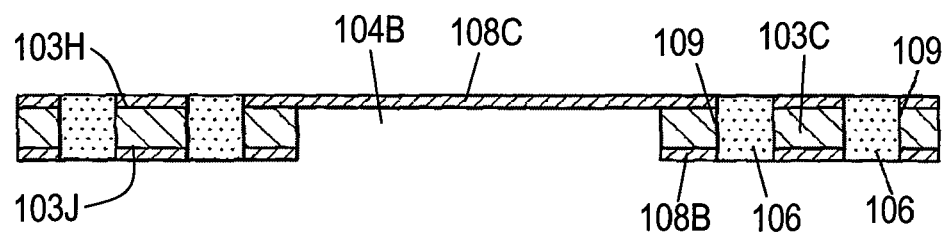
FIG. 3E is a sectional view of the circuit board in accordance with Embodiment 1 for illustrating the method of manufacturing the circuit board.
Figure 3F:
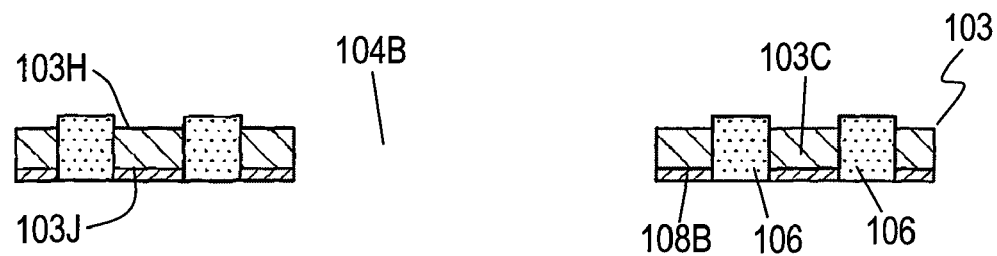
FIG. 3F is a sectional view of the circuit board in accordance with Embodiment 1 for illustrating the method of manufacturing the circuit board.

First, as shown in FIG. 3A, insulating layer 103C containing uncured thermoplastic resin 103D is prepared. Insulating layer 103C has first surface 103H and second surface 103J opposite to first surface 103H. Resin film 108A is attached to first surface 103H, similarly, resin film 108B is attached to second surface 103J. Resin films 108A and 108B are made of firm resin, such as polyethylene terephthalate (PET) film. Next, as shown in FIG. 3B, hole 104B to form recess 104 is formed in insulating layer 103C having resin films 108A and 108B attached thereto, or insulating layer 103C having resin films 108A and 108B attached thereto may be cut. Next, as shown in FIG. 3C, resin film 108A is peeled off, and then, resin film 108C is attached to first surface 103H. Resin film 108C is also made of firm resin, such as polyethylene terephthalate (PET) film. Then, as shown in FIG. 3D, through-hole 109 is formed in insulating layer 103C through resin films 108B and 108C. Then, as shown in FIG. 3E, conductive paste 106 fills through-hole 109 to form via-conductor 107, thus forming connection layer 103. Then, as shown in FIG. 3F, resin film 108C is peeled off from first surface 103H. Resin film 108B is not peeled off and is attached to second surface 103J.

Figure 4A:
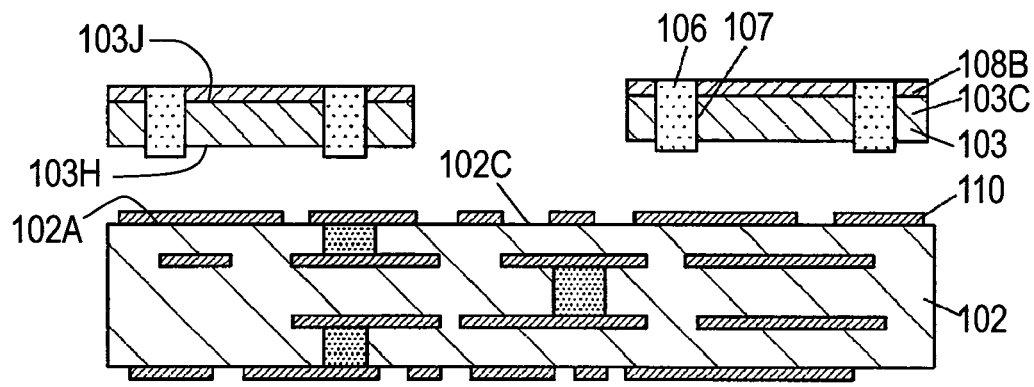
FIG. 4A is a sectional view of the circuit board in accordance with Embodiment 1 for illustrating the method of manufacturing the circuit board.
Figure 4B:
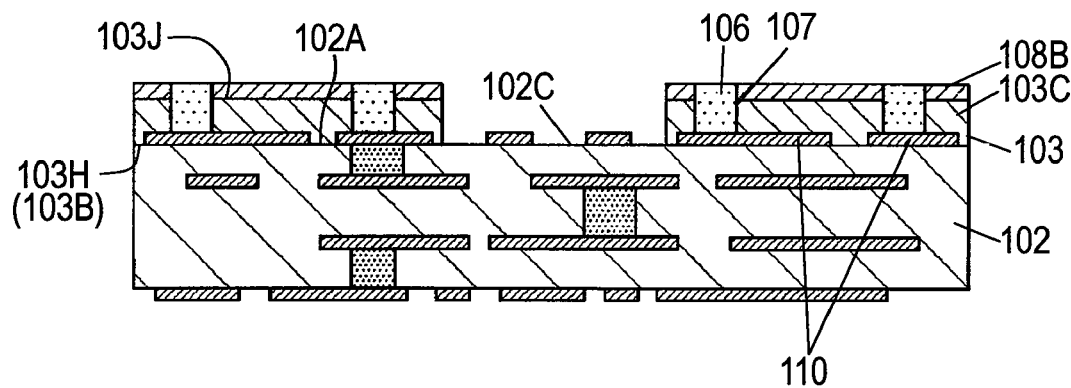
FIG. 4B is a sectional view of the circuit board in accordance with Embodiment 1 for illustrating the method of manufacturing the circuit board.
Figure 4C:
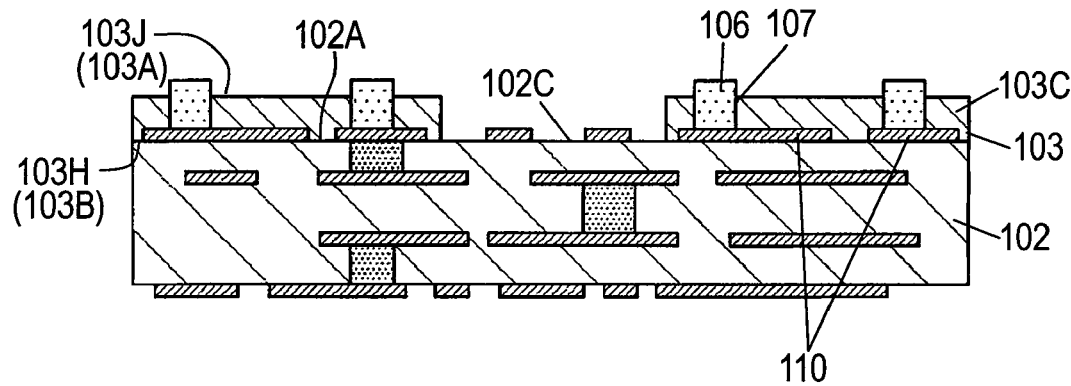
FIG. 4C is a sectional view of the circuit board in accordance with Embodiment 1 for illustrating the method of manufacturing the circuit board.

Next, as shown in FIGS. 4A and 4B, connection layer 103 is placed on upper surface 102A of lower substrate 102 such that first surface 103H of insulating layer 103C is situated on upper surface 102A of lower substrate 102. That is, first surface 103H of insulating layer 103C constitutes lower surface 103B of connection layer 103, and second surface 103J constitutes upper surface 103A. Wiring 110 is formed on upper surface 102A of lower substrate 102. While connection layer 103 is placed on lower substrate 102, wiring 110 is embedded in connection layer 103. This process compresses conductive paste 106 to connect conductive paste 106 securely onto wiring 110. After that, as shown in FIG. 4C, resin film 108B is peeled off from upper surface 103A of connection layer 103, i.e., second surface 103J of insulating layer 103C.

Figure 5A:
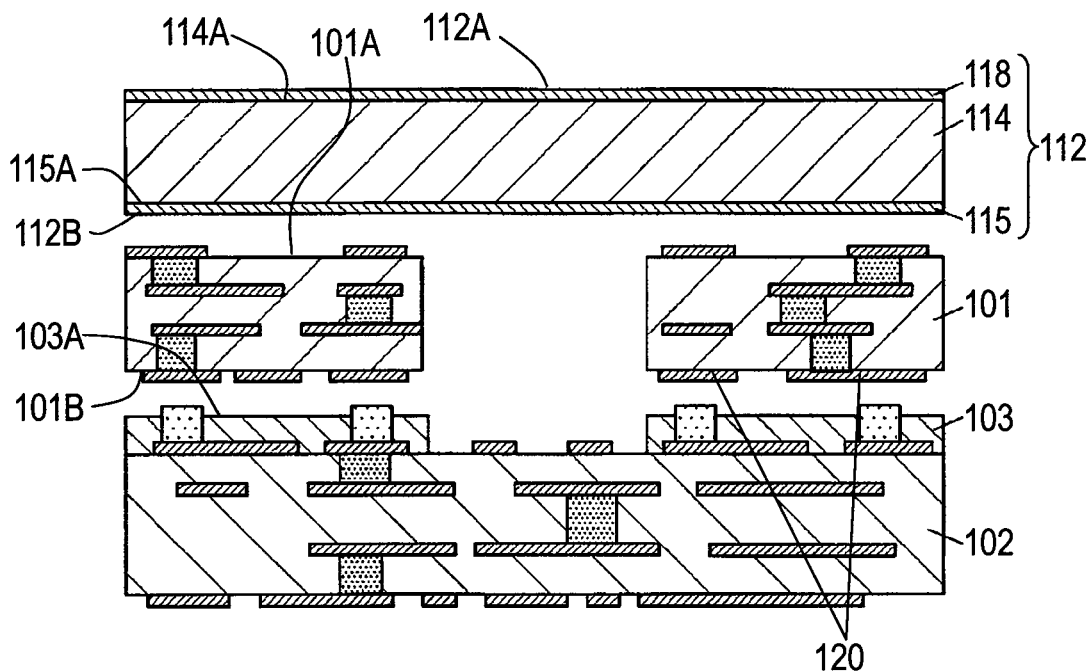
FIG. 5A is a sectional view of the circuit board in accordance with Embodiment 1 for illustrating the method of manufacturing the circuit board.

Next, as shown in FIG. 5A, upper substrate 101 is placed on connection layer 103 such that lower surface 101B of upper substrate 101 is situated on upper surface 103A of connection layer 103, i.e., second surface 103J of insulating layer 103C. Further, press sheet 112 is placed on upper surface 101A of upper substrate 101 to heat and pressurize upper substrate 101, connection layer 103, and upper substrate 102. Press sheet 112 has lower surface 112B contacting upper surface 101A of upper substrate 101, and upper surface 112A opposite to lower surface 112B. Press sheet 112 includes removable layer 115 provided at lower surface 112B, elastically-deformable layer 114 provided on upper surface 115A of removable layer 115, and removable layer 118 provided on upper surface 114A of elastically-deformable layer 114. Elastically-deformable layer 114 has a resistance to heat. Removable layer 118 is provided at upper surface 112A of press sheet 112. Elastically-deformable layer 114 is made of resin, such as silicone resin, which is elastically deformable, and is reversibly deformable.

While press sheet 112, upper substrate 101, connection layer 103, and lower substrate 102 are heated and pressurized, elastically-deformable layer 114 and removable layer 115 is pushed to enter into recess 104. Elastically-deformable layer 114 of press sheet 112 prevents thermoplastic resin 103D of connection layer 103 from flowing into recess 104. Thus, elastically-deformable layer 114 deforms along upper substrate 101 and recess 104 to cover upper substrate 101 and recess 104, thereby blocking the flow of resin 103D while being pressurized. Elastically-deformable layer 114 allows press sheet 112 to fill recess 104 almost entirely without a gap even is recess 104 is deep.

Figure 5B:
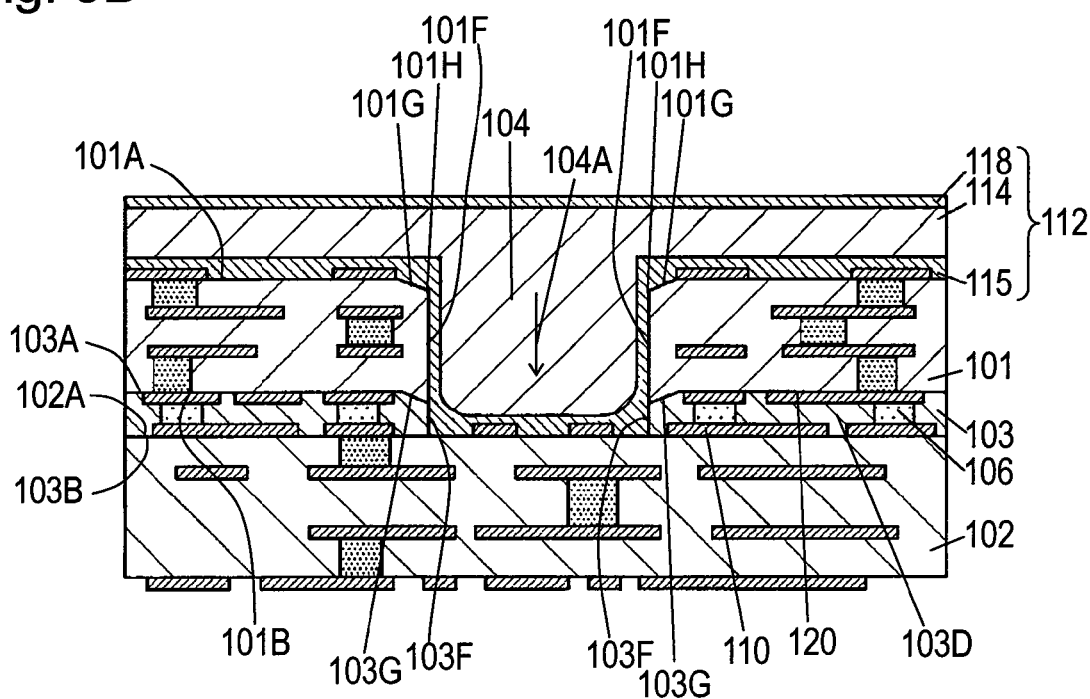
FIG. 5B is a sectional view of the circuit board in accordance with Embodiment 1 for illustrating the method of manufacturing the circuit board.

When elastically-deformable layer 114 is pushed to enter into recess 104, as shown in FIG. 5B, a portion of connection layer 103 adjacent to side surface 103F facing recess 104 is further compressed, so that portion 103G of upper surface 103A of connection layer 130 connected to side surface 103F inclines in direction 104A. This compression causes wiring 120 on lower surface 101B of upper substrate 101 to be embedded in upper surface 103A of connection layer 103. This process further compresses conductive paste 106, and connects conductive paste 106 securely to wirings 110 and 118. Upper substrate 101 is placed on connection layer 103 while upper substrate 101 itself is not compressed, to conform to the surface of connection layer 103. As a result, portion 101G of upper surface 101A of upper substrate 101 inclines in direction 104A so as to be parallel with portion 103G of upper surface 103A of connection layer 103. That is, upper substrate 101 has a constant thickness throughout upper surface 101A including inclining portion 101G.

Figure 5C:
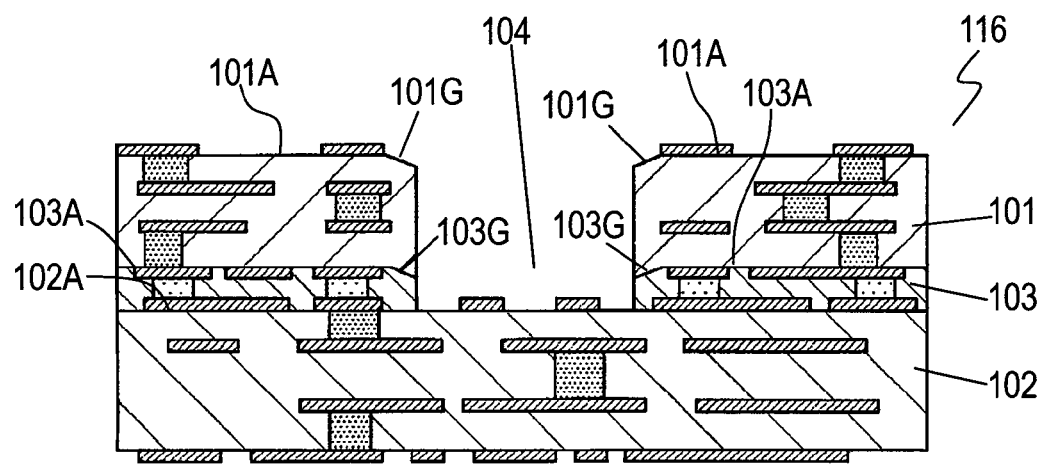
FIG. 5C is a sectional view of the circuit board in accordance with Embodiment 1 for illustrating the method of manufacturing the circuit board.

After that, press sheet 112, upper substrate 101, connection layer 103, and lower substrate 102 are cooled, and press sheet 112 is peeled off, thus providing circuit board 116, as shown in FIG. 5C. In circuit board 116, upper surface 101A of upper substrate 101 is connected to side surface 101F at edge 101H with an obtuse angle. The structure protects press sheet 112 from damage, and allows the press sheet to be peeled off circuit from board 116 without remaining on circuit board 116. During this cooling, elastically-deformable layer 114 of press sheet 112 tends to have its original shape of which layer 114 has had before the heating. This property of elastically-deformable layer 114 allows press sheet 112 to be removed from the depth of recess 104 easily.

In the above manufacturing processes, connection layer 103 is first placed on upper surface 102A of lower substrate 102 such that first surface 103H of insulating layer 103C is situated on upper surface 102A of lower substrate 102, and then, upper substrate 101 is placed on upper surface 103A of connection layer 103. According to Embodiment 1, connection layer 103 can be first placed on lower surface 101B of upper substrate 101 such that first surface 103H of insulating resin 103C is situated on lower surface 101B of upper substrate 101, and then, connection layer 103 can be placed on upper surface 102A of lower substrate 102.

A bottom of recess 104, i.e. portion 102C of upper surface 102A of lower substrate 102 easily collects thereon dust, such as powder of inorganic filler 103E. If the circuit board has a flat structure without recess 104, the dust is easily removed by a dust-collecting adhesive roller. However, such a roller can hardly collect the dust on the bottom of recess 104.

Figure 6:
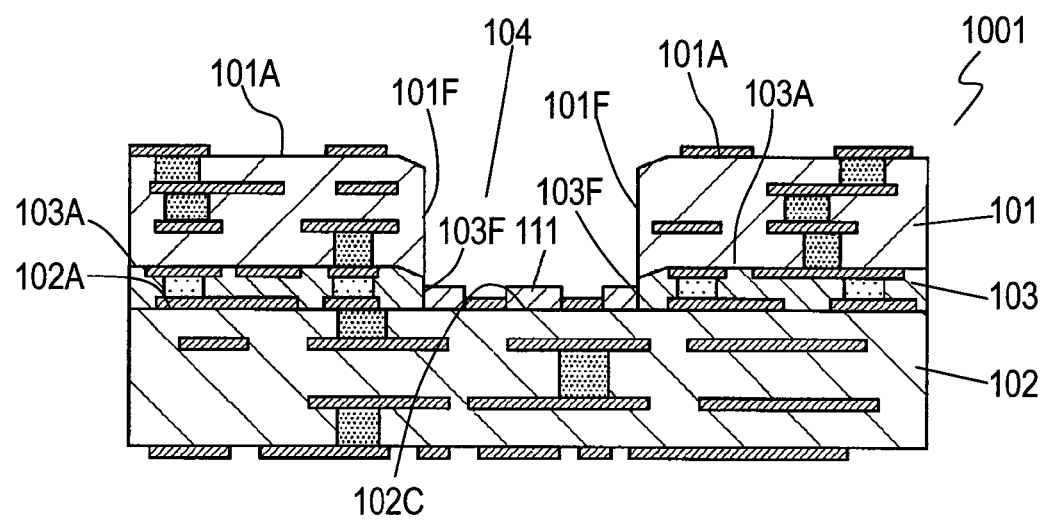
FIG. 6 is a sectional view of the circuit board in accordance with Embodiment 1 for illustrating the method of manufacturing the circuit board.

FIG. 6 is a sectional view of another circuit board 1001 according to Embodiment 1. In FIG. 6, components identical to those of circuit board 116 shown in FIG. 2 are denoted by the same reference numerals, and their description will be omitted. In circuit board 1001, insulating coat 111 can be provided on the bottom of recess 104 so as to cover the bottom of recess 104, i.e., portion 102C of upper surface 102A of lower substrate 102 in order to prevent dust from being accumulated in the recess so as to avoid a problem in mounting component 105. Insulating coat 111 is made of permanent resist having dry film shape having a thickness ranging from 5 µm to 30 µm. Insulating coat 111 may cover not only the bottom of recess 104, but also side surface 101F of upper substrate 101 and side surface 103F of connection layer 103. Insulating coat 111 prevents dust from being accumulation on the bottom of recess 104. Insulating coat 111 having a thickness smaller than 5 µm may have a pinhole therein, hence being prevented from covering the bottom sufficiently. Insulating coat 111 with a thickness exceeding 30 µm can hardly conform to the shape of recess 104. Insulating coat 111 may contain antistatic agent.

Connection layer 103 preferably has a thermal expansion coefficient not larger than a thermal expansion coefficient, such as 65 ppm/° C., of upper substrate 101 and lower substrate 102, more preferably, has a thermal expansion coefficient smaller than the a thermal expansion coefficient, such as 65 ppm/° C., of upper substrate 101 and lower substrate 102.

If connection layer 103 has a thermal expansion coefficient larger than that of upper substrate 101 and lower substrate 102, 65 ppm/° C., connection layer 103 may deform to cause circuit board 116 to warp or deform.

A glass-transition point of connection layer 103 measured by a dynamic mechanical analysis (DMA) method may be preferably not lower than 185° C., or is higher than the glass-transition point of substrates 101 and 102 by a difference more than 10° C. If the glass-transition point of connection layer 103 is lower than 185° C. or the difference is smaller than 10° C., the circuit board may deform or warp to have a complex undulation irreversibly.

Connection layer 103 includes no core material made of woven fabric, unwoven fabric, or film. Such a core material in connection layer 103 prevents wirings 110 and 118 on substrates 101 and 102 from being embedded in connection layer 103.

Figure 7:
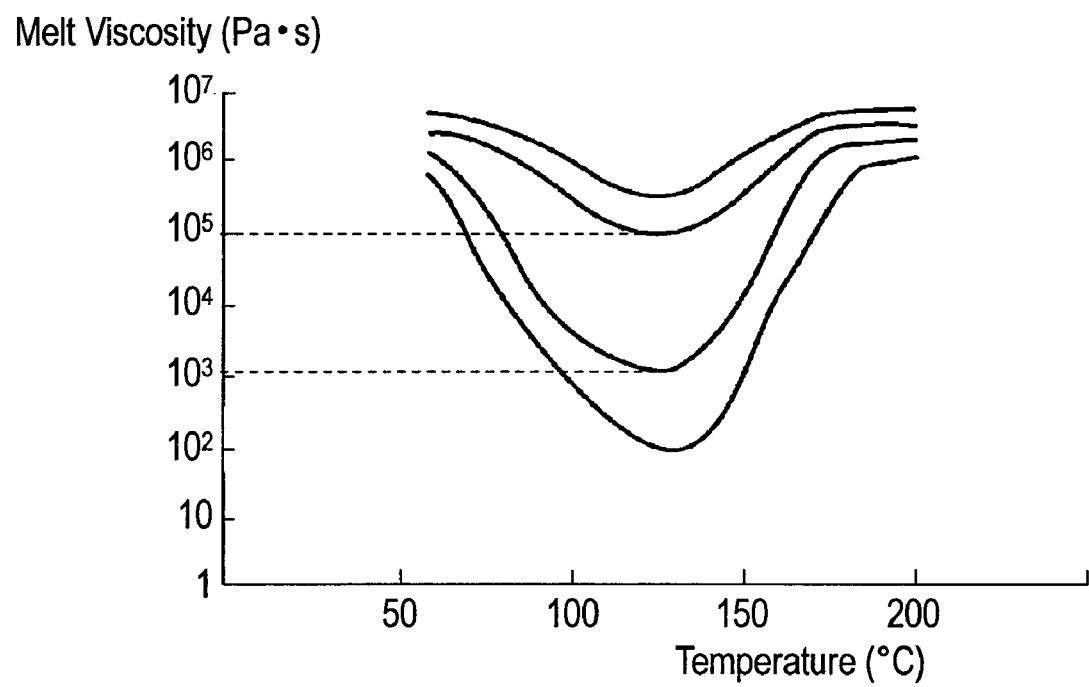
FIG. 7 shows a melt viscosity of the connection layer of the circuit board in accordance with Embodiment 1.

FIG. 7 shows a melt viscosity of connection layer 103. Appropriate minimum melt viscosity of connection layer 103 ranges from 1000 Pa·s to 100000 Pa·s. If the minimum melt viscosity is lower than 1000 Pa·s, thermoplastic resin 103D may flow excessively and easily into recess 104. If connection layer 103 has a minimum melt viscosity exceeding 100000

Pa·s, the connection layer may adhere to substrates 101 and 102 insufficiently or may prevent wirings 110 and 118 from being embedded in layer 103.

Connection layer 103 may contain coloring agent to improve mounting efficiency and light reflectivity Connection layer 103 may contain elastomer to suppress the flow of thermoplastic resin 103D, Upper substrate 101 and lower substrate 102 may be a double-sided board or a multi-layered board as long as they are resin substrates, such as a through-hole circuit board or an any IVH-structure multi-layer (ALIVH) circuit board. Plural substrates 101 and 102 and plural connection layers 103 may be alternately stacked.

The insulating material employed for upper substrate 101 and lower substrate 102 is made of composite material containing glass woven fabric and epoxy-based resin. The insulating material may be composite material containing thermoplastic resin and woven fabric of organic fibers selected from the group consisting of aramid and wholly aromatic polyester. The insulating material may be composite material containing thermoplastic resin and unwoven fabric made of organic fibers selected from the group consisting of p-aramide, polyimide, poly-p-phenylene benzobis oxazole, wholly aromatic polyester, polytetrafluoroethylene (PTFE), polyether sulfone, and polyetherimide. The insulating material may be composite material containing thermoplastic resin and unwoven fabric of glass fibers. The insulating material may be a composite material inclusing a synthetic resin film and thermoplastic-resin layers disposed on both surfaces of the film. The synthetic resin film is made of at least any one of p-aramide, poly-p-phenylene benzobis oxazole, wholly aromatic polyester, polyetherimide, polyether ketone, polyether ether ketone, polyethylene terephthalate, polytetrafluoroethylene, polyether sulfone, polyester terephthalate, polyimide, and polyphenylene sulfide.

Thermoplastic resin 103D of connection layer 103 can be a thermoplastic resin at least one selected from the group consisting of epoxy resin, polybutadiene resin, phenol resin, polyimide resin, polyamide resin, and cyanate resin.

Exemplary Embodiment 2

Figure 8A:
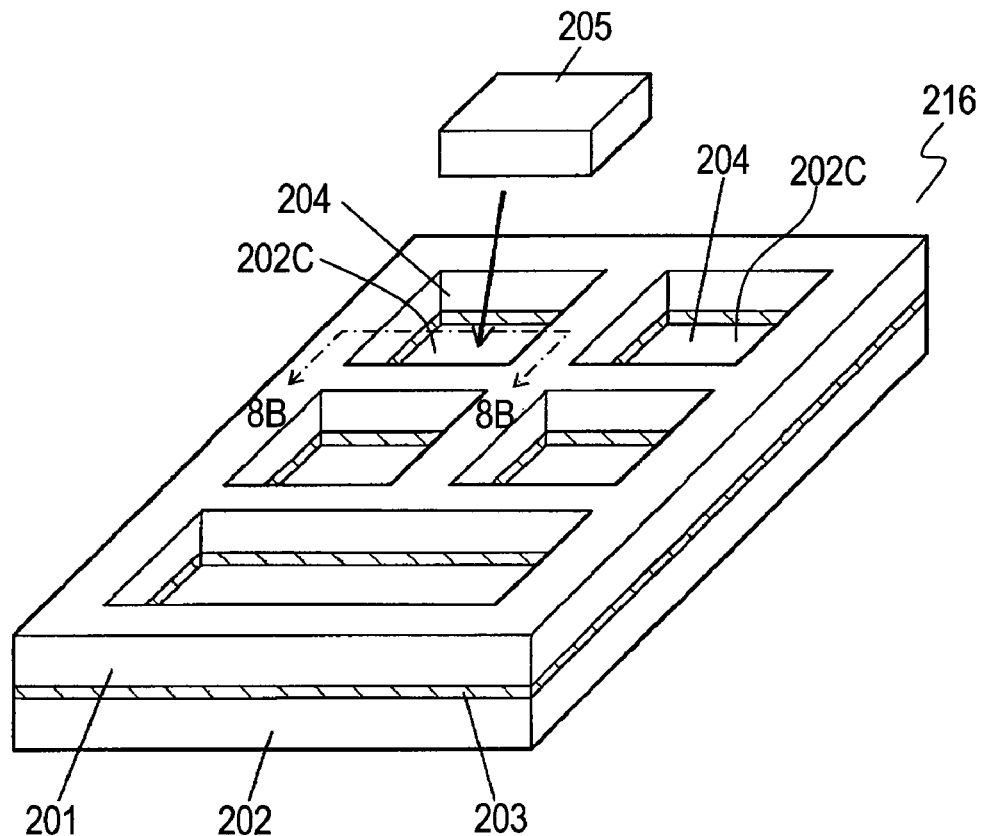
FIG. 8A is a perspective view of a three-dimensional circuit board in accordance with Exemplary Embodiment 2 of the invention.
Figure 8B:
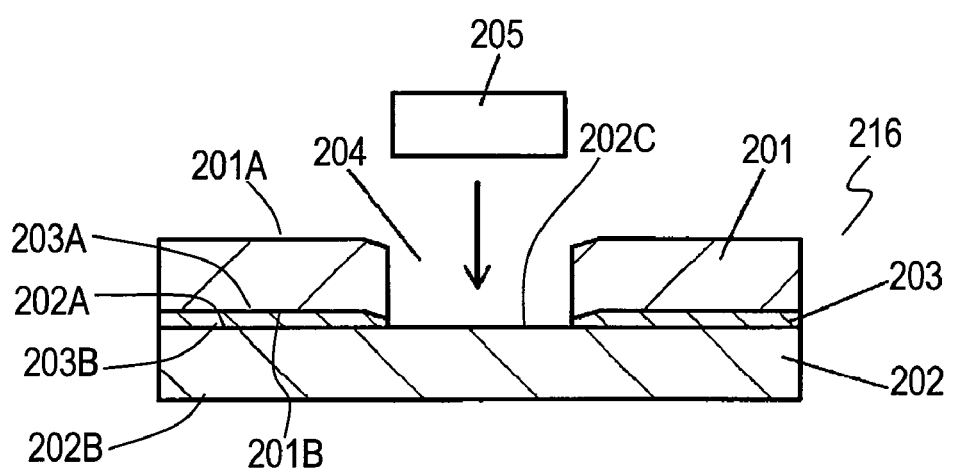
FIG. 8B is a sectional view of the circuit board on line 8B-8B shown in FIG. 8A.

FIG. 8A is a perspective view of circuit board 216 in accordance with Exemplary Embodiment 2 of the present invention. FIG. 8B is a sectional view taken of circuit board 216 on line 8B-8B shown in FIG. 8A. Circuit board 216 includes lower substrate 202, connection layer 203 provided on upper surface 202A of lower substrate 202, and upper substrate 201 provided on upper surface 203A of connection layer 203. Upper substrate 201 and lower substrate 202 are different in shape. Connection layer 203 has a thickness ranging from 30 μm to 300 μm. Connection layer 203 is provided on upper surface 202A of lower substrate 202 to expose portion 202C of upper surface 202A. That is, recess 204 is surrounded by connection layer 203 and upper substrate 201 and is located directly above portion 202C of upper surface 202A of lower substrate 202. Wirings are formed on upper surface 201A and lower surface 201B of upper substrate 201, and on upper surface 202A and lower surface 202B of lower substrate 202. Component 205 is accommodated in recess 204 and mounted on circuit board 216. The structure reduces a total thickness of circuit board 216 having component 205 mounted thereto.

Figure 8C:
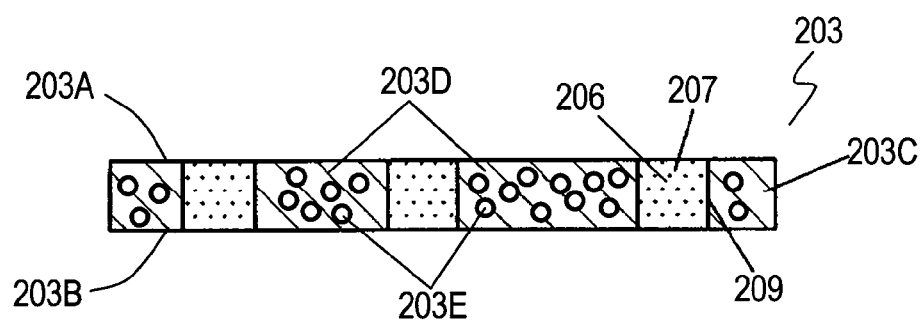
FIG. 8C is a sectional view of a connection layer of the circuit board in accordance with Embodiment 2.

FIG. 8C is a sectional view of connection layer 203. Connection layer 203 includes insulating layer 203C having upper surface 203A and lower surface 203B, and via-conductor 207 provided in insulating layer 203C. Insulating layer 203C has through-hole 209 communicating with upper surface 203A to lower surface 203B. Through-hole 209 is filled with conductive paste 206 made of conductive material, hence providing via-conductor 207. Insulating layer 203C includes thermoplastic resin 203D, such as epoxy resin, and inorganic filler 203E dispersed in thermoplastic resin 203D. Connection layer 203 is made of substantially uniform material from the upper surface 203A to lower surface 203B, thus containing no core material made of woven fabric, unwoven fabric, or film. Connection layer 203 having a thickness smaller than 30 μm prevents the wirings from being embedded in connection layer 203. Connection layer 203 having a thickness exceeding 300 μm requires via-conductor 207 to have a small diameter to maintain the aspect ratio of via-conductor 207. This can prevent via-conductor 207 from being formed easily, deteriorating poor connection reliability.

Inorganic filler 203E is preferably made of at least any one of silica, alumina, and barium titanate. Inorganic filler 203E has a particle diameter ranging from 1 μm to 15 μm. Insulating layer 203C preferably contains 70 wt % to 90 wt % of inorganic filler 203E. The content of inorganic filler 203E smaller than 70 wt % may cause inorganic filler 203E to move according to the flow of thermoplastic resin 203D during the pressurizing process of thermoplastic resin 203D. The content of inorganic filler 203E exceeding 90 wt % prevents the wirings from being embedded in insulating layer 203C, and prevents insulating layer 203C from being adhered securely to substrates 201 and 202.

Conductive paste 206 is preferably made of any one of copper, silver, gold, palladium, bismuth, tin, and alloy thereof. The particle diameter of conductive paste 106 ranges preferably from 1 μm to 20 μm.

Figure 9:
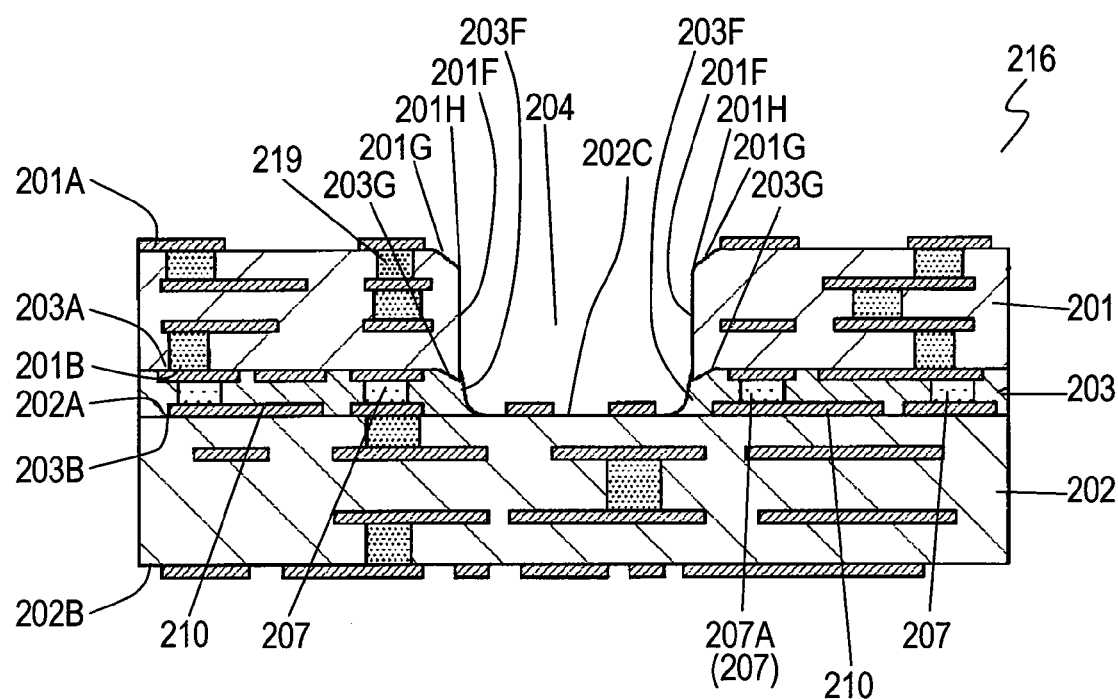
FIG. 9 is a sectional view of the circuit board in accordance with Embodiment 2.

FIG. 9 is a sectional view of circuit board 216. Recess 204 is surrounded by portion 202C of upper surface 202A of lower substrate 202, side surface 203F of connection layer 203, and side surface 201F of upper substrate 201. In other words, portion 202C of upper surface 202A of lower substrate 202, side surface 203F of connection layer 203, and side surface 201F of upper substrate 201 face recess 204. Portion 203G of upper surface 203A connected to side surface 203F inclines downward toward recess 204, that is, inclines in direction 204A toward portion 202C of upper surface 202A of lower substrate 202. Portion 201G of upper surface 201A connected to side surface 201F downwardly inclines toward recess 204, that is, inclines in direction 204A toward portion 202C of upper surface 202A of lower substrate 202. Portion 203G of upper surface 203A of connection layer 203 has a curved surface chamfered in a rounded shape. Similarly, portion 201G of upper surface 201A of upper substrate 201 has a curved surface chamfered in a rounded shape. This structure allows edge 201H at which upper surface 201A of upper substrate 201 is connected to side surface 201F to have a curved surface having a rounded shape. Upper substrate 201 has a constant thickness entirely along upper surface 201A including portion 201G having the curved surface. That is, portion 201G of upper surface 201A of upper substrate 201 is parallel to portion 203G of upper surface 203A of connection layer 203. Side surface 203F of connection layer 203 facing recess 204 has a curved shape.

If a via-conductor is provided in portion 201G of upper surface 201A and portion 203G of upper surface 203A, the via-conductor may incline due to the curved surface. To avoid this, each of portion 201G and portion 203G is formed between the edge of recess 204 and the via-conductor closest to the edge. Plural holes in upper substrate 201 are filled with conductive paste so as to form plural via-conductors 219. Via-conductor 207A out of via-conductors 207 and 219 is the closest to recess 204, i.e., side surfaces 203F and 201F. Each of curved portion 201G of upper surface 201A and curved portion 203G of upper surface 203 is formed between side surfaces 201F, 203F and via-conductor 207A. That is, there is no via-conductor in portion 201G of upper surface 201A of upper substrate 201 and in portion 203G of upper surface 203A of connection layer 203.

Figure 10:
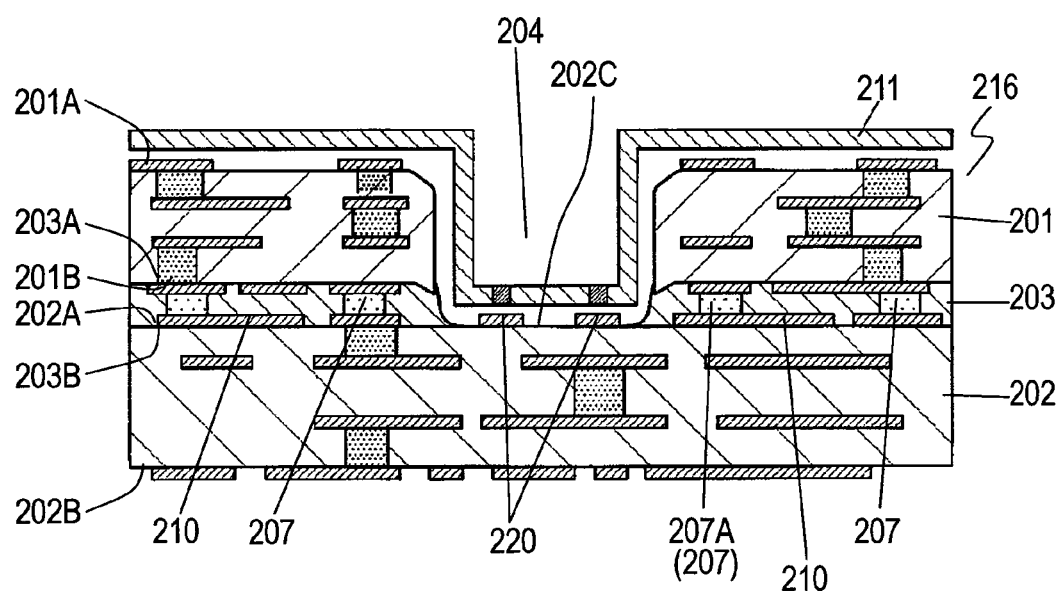
FIG. 10 is a sectional view of the circuit board in accordance with Exemplary Embodiment 2.

FIG. 10 is a sectional view of circuit board 216 having print mask 211 placed in recess 204 for solder printing on land 220 provided on the bottom of recess 204 (i.e. on portion 202C of upper surface 202A of lower substrate 202). Recess 204 having curved corners allows print mask 211 to be placed easily. During placing print mask 211 in the recess or removing it from the recess, if the land and the print mask are aligned accurately, the mask may contact the edge of recess 204 and provide circuit board 116 with damage. However, the curved corners of recess 204 protect the structure from damage.

The total thickness of upper substrate 201 and connection layer 203, i.e., the depth formed by side surfaces 201F and 203F is smaller than the height of component 205 that is to be mounted in recess 204. This structure allows component 205 and a tool used for mounting to be easily inserted in the recess, thus allowing component 205 to be mounted efficiently. The length of each of portion 201G of upper surface 201A of upper substrate 201 and portion 203G of upper surface 203A of connection layer 203 in a direction perpendicular to side surfaces 201F and 203F, respectively, is greater than the chucking allowance of the tool used for mounting. Specifically, the length is not larger than 1.0 mm, more preferably, is not larger than 0.3 mm.

A method for manufacturing circuit board 216 in accordance with Embodiment 2 will be described below. FIGS. 11A to 11F, 12A to 12C, and 13A to 13C are sectional views of circuit board 216 for illustrating processes for manufacturing circuit board 216.

Figure 11A:
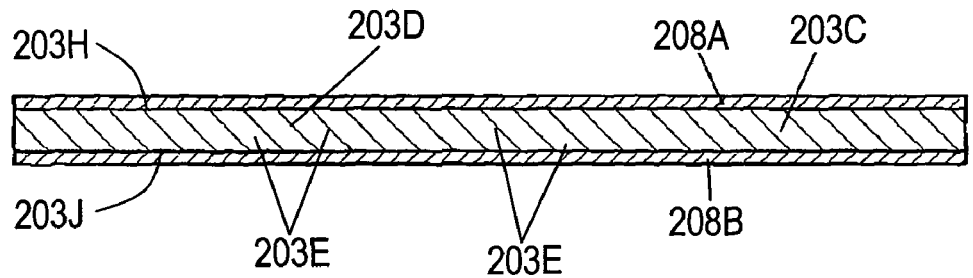
FIG. 11A is a sectional view of the circuit board in accordance with Embodiment 2 for illustrating a method of manufacturing the circuit board.
Figure 11B:
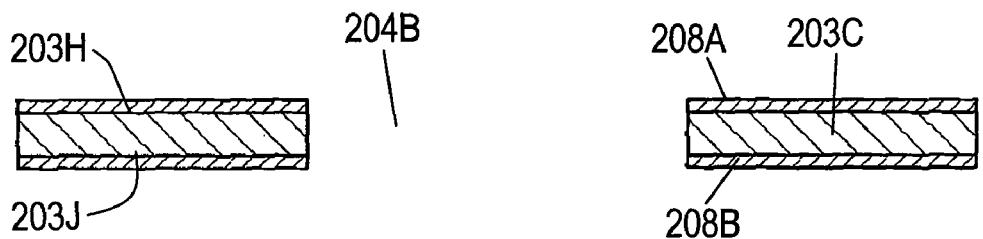
FIG. 11B is a sectional view of the circuit board in accordance with Embodiment 2 for illustrating the method of manufacturing the circuit board.
Figure 11C:
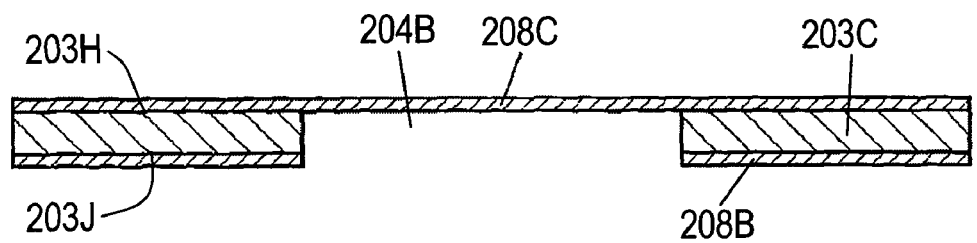
FIG. 11C is a sectional view of the circuit board in accordance with Embodiment 2 for illustrating the method of manufacturing the circuit board.
Figure 11D:
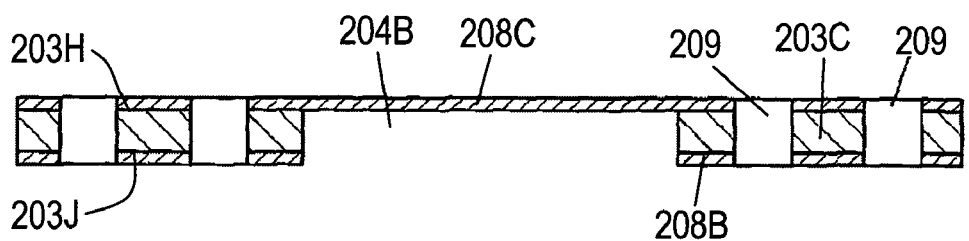
FIG. 11D is a sectional view of the circuit board in accordance with Embodiment 2 for illustrating the method of manufacturing the circuit board.
Figure 11E:
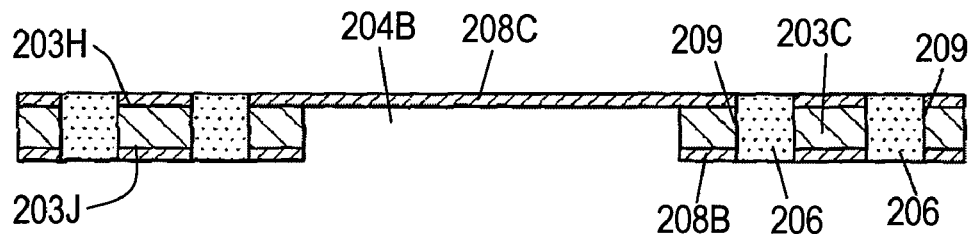
FIG. 11E is a sectional view of the circuit board in accordance with Embodiment 2 for illustrating the method of manufacturing the circuit board.
Figure 11F:
FIG. 11F is a sectional view of the circuit board in accordance with Embodiment 2 for illustrating the method of manufacturing the circuit board.

First, as shown in FIG. 11A, insulating layer 203C containing uncured thermoplastic resin 203D is prepared. Insulating layer 203C has first surface 203H and second surface 203J opposite to first surface 203H. Resin films 208A and resin film 208B are attached to first surface 203H and second surface 203J, respectively. Resin films 208A and 208B are made of firm resin, such as polyethylene terephthalate (PET) film. Next, as shown in FIG. 11B, in order to form recess 204, hole 204B is formed in insulating layer 203C having resin films 208A and 208B attached thereto. Instead, insulating layer 203C with resin films 208A and 208B may be cut in two. Next, as shown in FIG. 11C, resin film 208A is peeled off, and then, resin film 208C is attached to first surface 203H. Resin film 208C is also made of firm resin, such as polyethylene terephthalate (PET) film. Then, as shown in FIG. 11D, through-hole 209 is formed in insulating layer 203C through resin films 208B and 208C. Then, as shown in FIG. 11E, conductive paste is provided in through-hole 209 to form via-conductor 207, thereby providing connection layer 203. Then, as shown in FIG. 11F, resin film 208C is peeled off from first surface 203H while resin film 208B is maintained on second surface 203J.

Figure 12A:
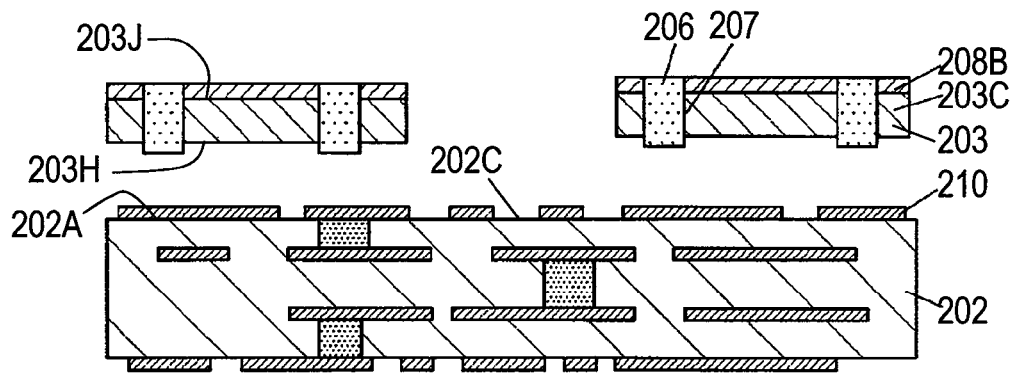
FIG. 12A is a sectional view of the circuit board in accordance with Embodiment 2 for illustrating the method of manufacturing the circuit board.
Figure 12B:
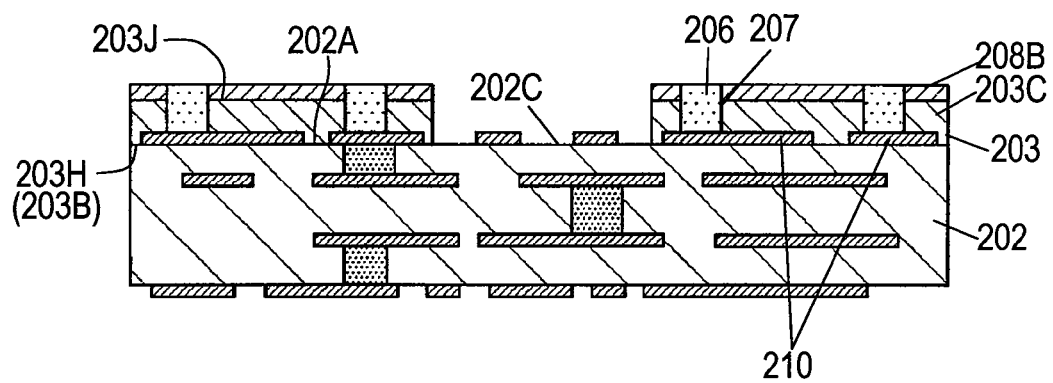
FIG. 12B is a sectional view of the circuit board in accordance with Embodiment 2 for illustrating the method of manufacturing the circuit board.
Figure 12C:
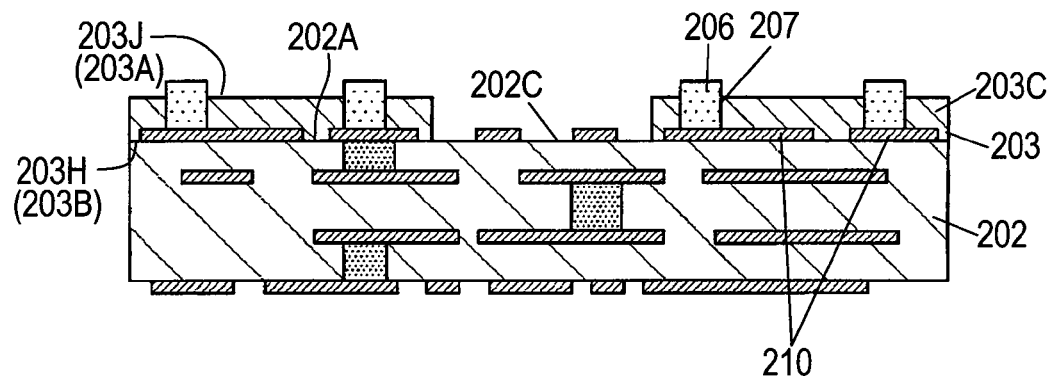
FIG. 12C is a sectional view of the circuit board in accordance with Embodiment 2 for illustrating the method of manufacturing the circuit board.

Next, as shown in FIGS. 12A and 12B, connection layer 203 is placed on upper surface 202A of lower substrate 202 such that first surface 203H of insulating layer 203C is situated on upper surface 202A of lower substrate 202. That is, first surface 203H of insulating layer 203C constitutes lower surface 203B of connection layer 203, and second surface 203J constitutes upper surface 203A. Wiring 210 is provided on upper surface 202A of lower substrate 202. While connection layer 203 is placed on lower substrate 202, wiring 210 is embedded in connection layer 203. This allows conductive paste 206 to contact wiring 210 to electrically connecting the conductive layer and the wiring securely. After that, as shown in FIG. 12C, resin film 208B is peeled off from upper surface 203A of connection layer 203, i.e., second surface 203J of insulating layer 203C.

Figure 13A:
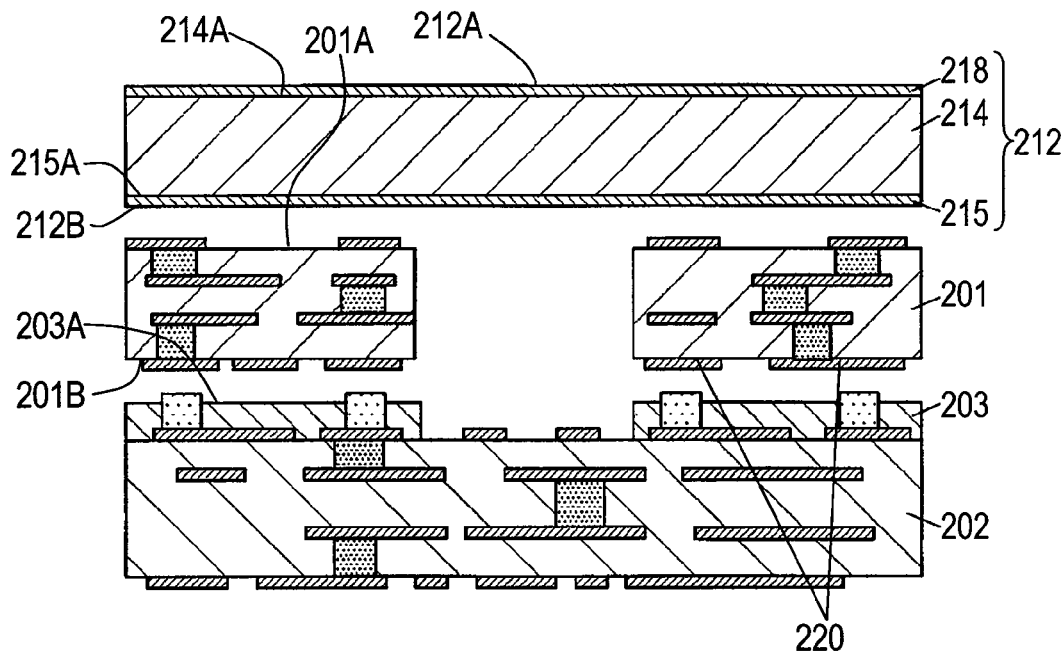
FIG. 13A is a sectional view of the circuit board in accordance with Embodiment 2 for illustrating the method of manufacturing the circuit board.

Next, as shown in FIG. 13A, upper substrate 201 is placed on connection layer 203 such that lower surface 201B of upper substrate 201 is situated on upper surface 203A of connection layer 203, i.e., second surface 203J of insulating layer 203C. Further, press sheet 212 is placed on upper surface 201A of upper substrate 201 and adhered to upper substrate 201, connection layer 203, and upper substrate 202 with heat and pressure applied thereto. Press sheet 212 has lower surface 212B contacting upper surface 201A of upper substrate 201, and upper surface 212A opposite to lower surface 212B. Press sheet 212 has removable layer 215 provided at lower surface 212B, elastically-deformable layer 214 provided on upper surface 215A of removable layer 215, and removable layer 218 provided on upper surface 214A of elastically-deformable layer 214. Elastically-deformable layer 214 is resistant to heat. Removable layer 218 is provided at upper surface 212A of press sheet 212. Elastically-deformable layer 214 is made of resin, such as silicone resin, which is elastically deformable.

Figure 13B:
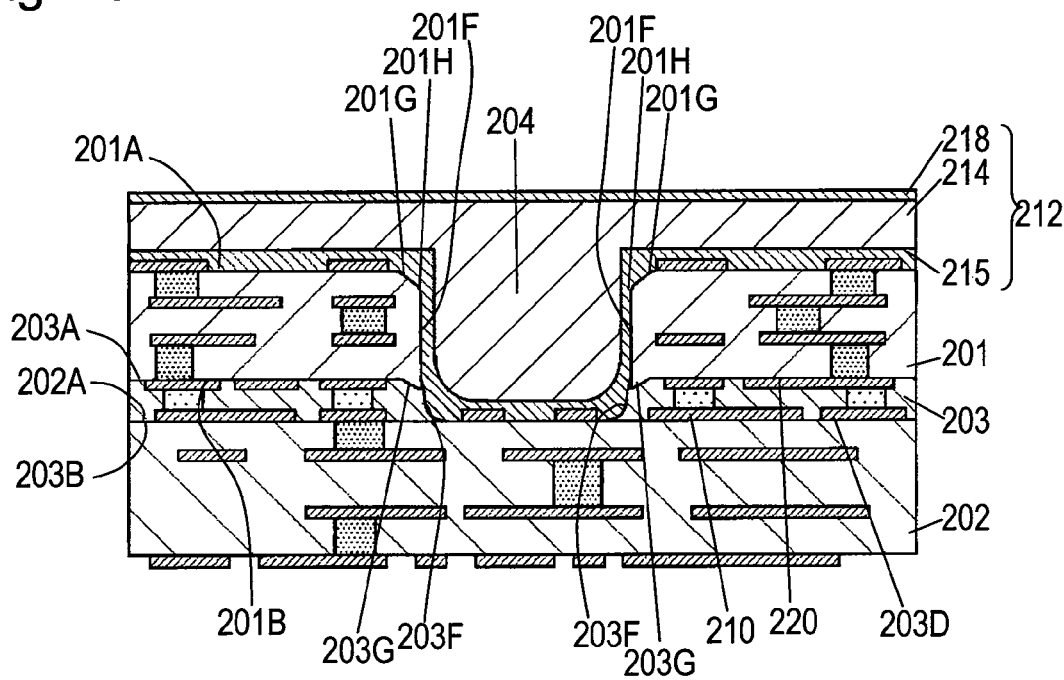
FIG. 13B is a sectional view of the circuit board in accordance with Embodiment 2 for illustrating the method of manufacturing the circuit board.

As shown in FIG. 13B, upon press sheet 212, upper substrate 201, connection layer 203, and lower substrate 202 are heated and compressed, elastically-deformable layer 214 and removable layer 215 enter into recess 204, hence preventing thermoplastic resin 203D of connection layer 203 from flowing into recess 204. Thus, elastically-deformable layer 214 deforms to cover upper substrate 201 and recess 204, blocking the flow of resin 203D in the compression process. Elastically-deformable layer 214 allows press sheet 212 to fill recess 204 without a gap even if recess 204 is deep.

When elastically-deformable layer 214 is pushed into recess 204, as shown in FIG. 13B, a portion of connection layer 203 adjacent to side surface 203F is further compressed, so that portion 203G connected to side surface 203F of connection layer 203 inclines in direction 204A to have a curved shape. The compressing allows wiring 219 of lower surface 201B of upper substrate 201 to be embedded in upper surface 203A of connection layer 203. This further compresses conductive paste 206, accordingly connecting wirings 210 and 218 securely. Upper substrate 201 itself is stacked on connection layer 203, without being compressed, so as to conform to the surface of connection layer 203. As a result, portion 201G of upper surface 201A of upper substrate 201 inclines in direction 204A to have a curved shape parallel with portion 203G of upper surface 203A of connection layer 203. That is, upper substrate 201 has a constant thickness throughout upper surface 201A including portion 201G.

Figure 13C:
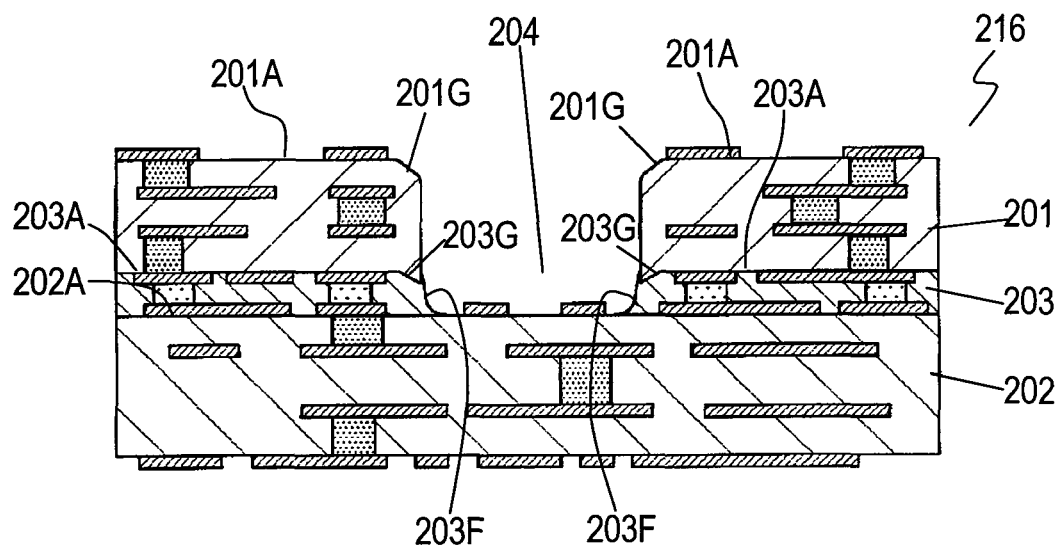
FIG. 13C is a sectional view of the circuit board in accordance with Embodiment 2 for illustrating the method of manufacturing the circuit board.

After that, press sheet 212, upper substrate 201, connection layer 203, and lower substrate 202 are cooled, and press sheet 212 is peeled off, hence providing circuit board 216, as shown in FIG. 13C. In circuit board 216, upper surface 201A of upper substrate 201 is connected to side surface 201F at edge section 201H with a curved shape. The structure protects press sheet 212 from damage, allowing the sheet to be thoroughly peeled off circuit board 216. In the cooling process, elastically-deformable layer 214 of press sheet 212 tends to have its original shape before heated. Elastically-deformable layer 214 allows press sheet 212 to be removed from recess 204 easily even if recess 204 is deep.

In the above manufacturing processes, firstly, connection layer 203 is placed on upper surface 202A of lower substrate 202 such that first surface 203H of insulating layer 203C is situated on upper surface 202A of lower substrate 202, and then first substrate 201 is placed on upper surface 203A of connection layer 203. According to Embodiment 2, firstly, connection layer 203 may be placed on lower surface 201B of upper substrate 201 such that first surface 203H of insulating resin 203C is situated on lower surface 201B of upper substrate 201, and then, connection layer 203 may be placed on upper surface 202A of lower substrate 202.

A thermal expansion coefficient of connection layer 203 is not larger than the coefficient, e.g. 65 ppm/° C. of upper substrate 201 and lower substrate 202, more preferably, may be smaller than 65 ppm/° C.

The thermal expansion coefficient of connection layer 203 smaller than 4 ppm/° C. unpreferably has a thermal expansion coefficient of component 205 made of semiconductor material, such as silicon.

If connection layer 203 has a thermal expansion coefficient larger than that of upper substrate 201 and lower substrate 202 (i.e. exceeding 65 ppm/° C.), connection layer 203 may deform to cause circuit board 216 to warp or deform.

A glass-transition point of connection layer 203 measured by a dynamic mechanical analysis (DMA) method may be preferably not lower than 185° C., or is higher than the glass-transition point of substrates 201 and 202 by a difference more than 10° C. If the glass-transition point of connection layer 203 is lower than 185° C. or the difference is smaller than 10° C., the circuit board may deform or warp to have a complex undulation irreversibly.

Connection layer 203 includes no core material made of woven fabric, unwoven fabric, or film. Such a core material in connection layer 203 prevents wirings 210 and 218 on substrates 201 and 202 from being embedded in connection layer 203.

Figure 14:
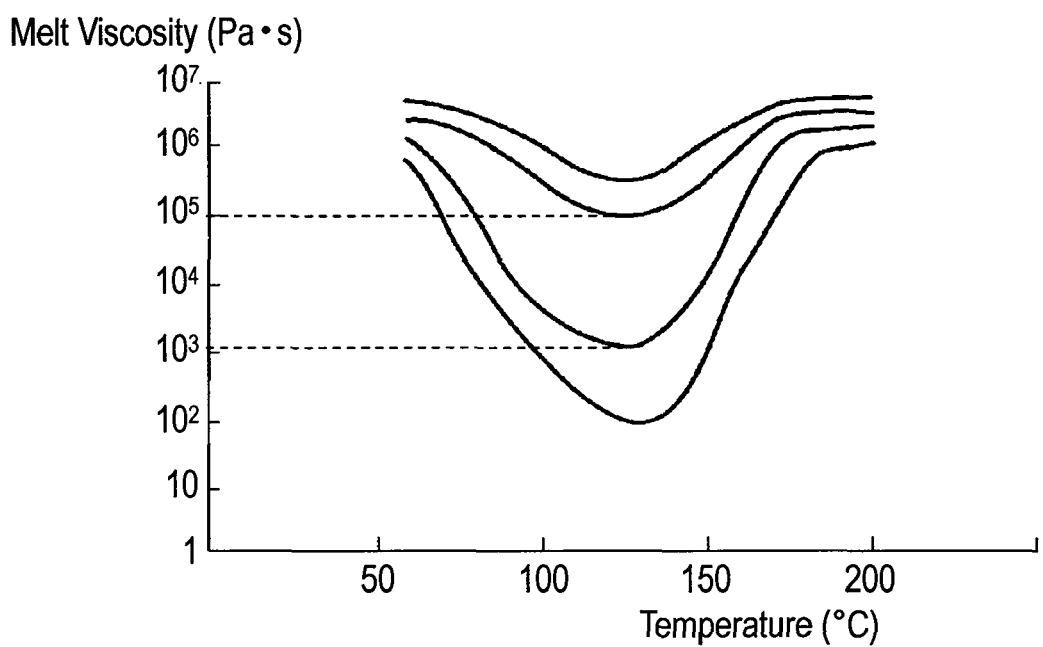
FIG. 14 shows a melt viscosity of a connection layer of the circuit board in accordance with Embodiment 2.
Figure 15A:
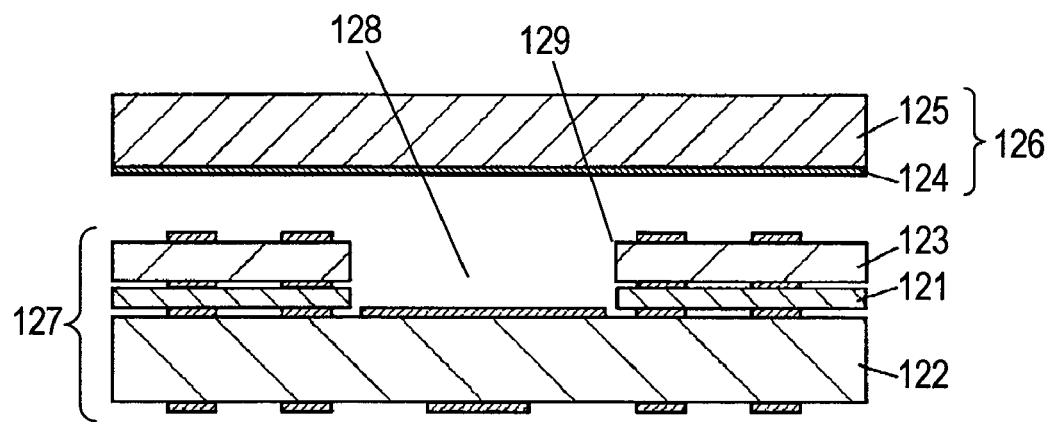
FIG. 15A is a sectional view of a conventional circuit board for illustrating a method of manufacturing the conventional circuit board.
Figure 15B:
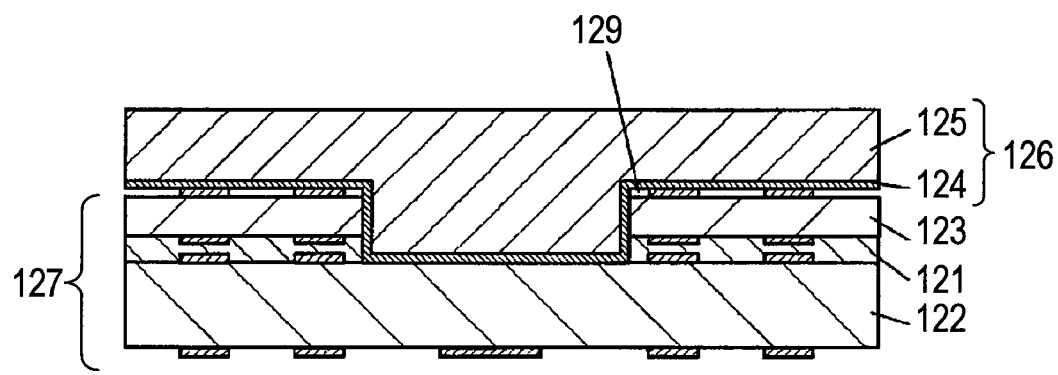
FIG. 15B is a sectional view of the conventional circuit board for illustrating the method of manufacturing the conventional circuit board.
Figure 16:
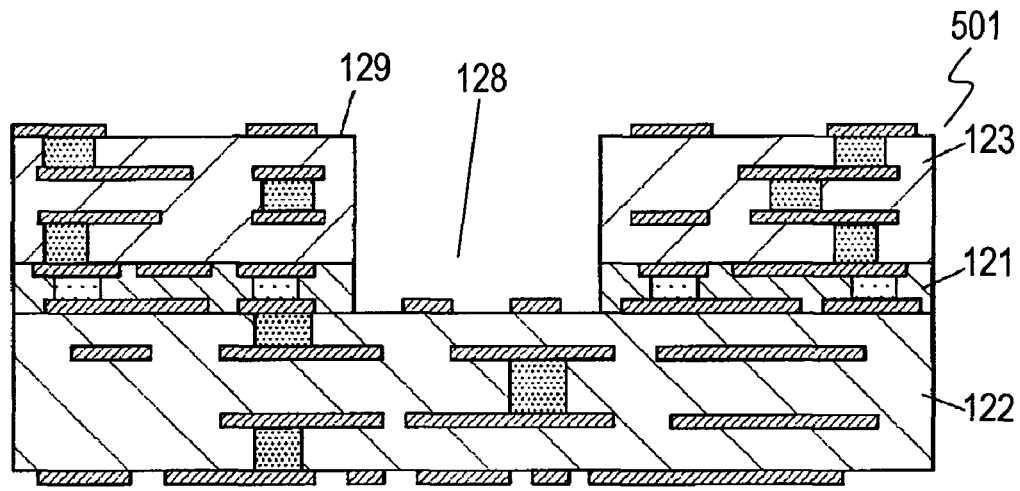
FIG. 16 is a sectional view of a conventional circuit board.
Figure 17:
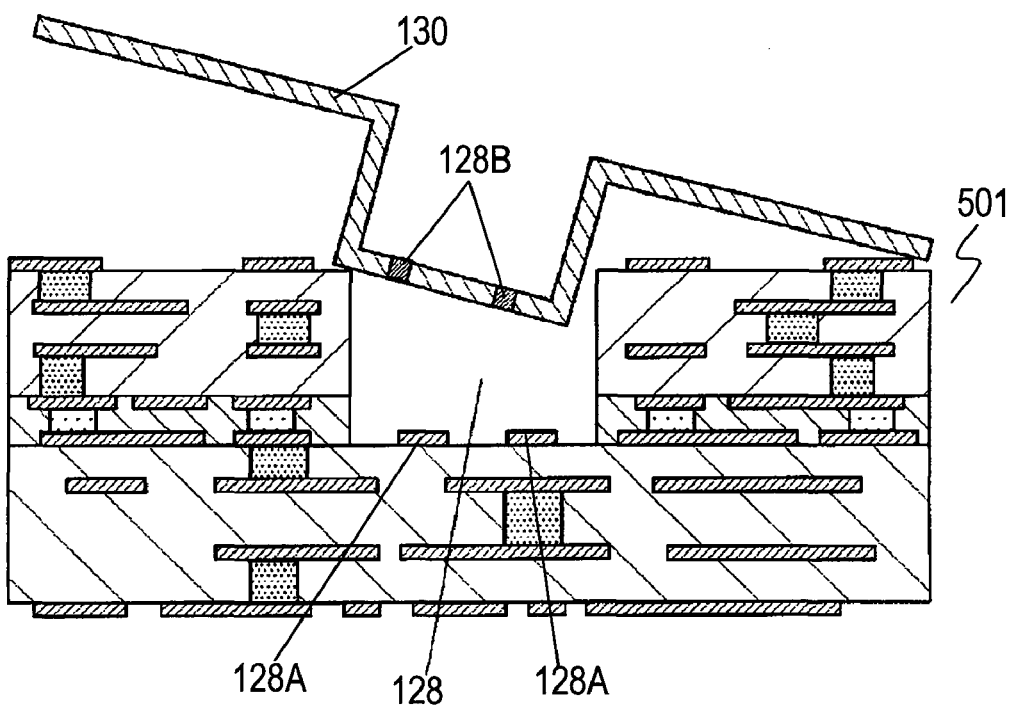
FIG. 17 is a sectional view showing a process of manufacturing the conventional circuit board shown in FIG. 16.

FIG. 14 shows a melt viscosity of connection layer 203. Appropriate minimum melt viscosity of connection layer 203 ranges from 1000 Pa·s to 100000 Pa·s. If the minimum melt viscosity is lower than 1000 Pa·s, thermoplastic resin 203D may flow excessively and easily into recess 204. If connection layer 203 has a minimum melt viscosity exceeding 100000 Pa·s, the connection layer may adhere to substrates 201 and 202 insufficiently or may prevent wirings 210 and 218 from being embedded in layer 203.

Connection layer 203 may contain coloring agent to improve mounting efficiency and light reflectivity Connection layer 203 may contain elastomer to suppress the flow of thermoplastic resin 203D, Upper substrate 201 and lower substrate 202 may be a double-sided board or a multi-layered board as long as they are resin substrates, such as a through-hole circuit board or an any IVH-structure multi-layer (ALIVH) circuit board. Plural substrates 201 and 202 and plural connection layers 203 may be alternately stacked.

The insulating material employed for upper substrate 201 and lower substrate 202 is made of composite material containing glass woven fabric and epoxy-based resin. The insulating material may be composite material containing thermoplastic resin and woven fabric of organic fibers selected from the group consisting of aramid and wholly aromatic polyester. The insulating material may be composite material containing thermoplastic resin and unwoven fabric made of organic fibers selected from the group consisting of p-aramide, polyimide, poly-p-phenylene benzobis oxazole, wholly aromatic polyester, polytetrafluoroethylene (PTFE), polyether sulfone, and polyetherimide. The insulating material may be composite material containing thermoplastic resin and unwoven fabric of glass fibers. The insulating material may be a composite material inclusing a synthetic resin film and thermoplastic-resin layers disposed on both surfaces of the film. The synthetic resin film is made of at least any one of p-aramide, poly-p-phenylene benzobis oxazole, wholly aromatic polyester, polyetherimide, polyether ketone, polyether ether ketone, polyethylene terephthalate, polytetrafluoroethylene, polyether sulfone, polyesther terephthalate, polyimide, and polyphenylene sulfide.

Thermoplastic resin 203D of connection layer 203 can be a thermoplastic resin at least one selected from the group consisting of epoxy resin, polybutadiene resin, phenol resin, polyimide resin, polyamide resin, and cyanate resin.

In the above embodiments, terms, such as "upper surface", "lower surface", "directly", and "downwardly", indicating directions indicate relative directions that depend on the positions of components of circuit boards 116, 216, such as including upper substrates 101 and 201, lower substrates 102 and 202, and connection layers 103 and 203, and do not indicate an absolute direction, such as a vertical direction.

INDUSTRIAL APPLICABILITY

A three-dimensional circuit board according to the present invention can have a low profile even if having a component mounted thereto, hence being useful for of devices, such as personal computers, digital cameras, and mobile phones, having a small size, a low profile, and a small weight with a high resolution and multiple functions.

The invention claimed is:
1. A three-dimensional circuit board comprising:
a lower substrate having an upper surface;
a connection layer provided on the upper surface of the lower substrate to expose a portion of the upper surface of the lower substrate; and
an upper substrate provided on an upper surface of the connection layer, wherein
the connection layer includes
an insulating layer having a through-hole provided therein, the insulating layer containing thermoplastic resin and inorganic filler dispersed in the thermoplastic resin, and
a via-conductor made of conductive material filling the through-hole,
a recess is provided directly above the portion of the upper surface of the lower substrate and is surrounded by a side surface of the upper substrate and a side surface of the connection layer,
a portion of the upper surface of the connection layer connected to the side surface of the connection layer inclines in a direction toward the portion of the upper surface of the lower substrate,
the portion of the upper surface of the connection layer is provided from the side surface of the connection layer to the via-conductor, and
a portion of an upper substrate of the upper substrate connected to the side surface of the upper substrate inclines in a direction toward the portion of the upper surface of the lower substrate.
2. The three-dimensional circuit board according to claim 1, wherein the connection layer has a thickness ranging from 30 μm to 300 μm.
3. The three-dimensional circuit board according to claim 1, wherein
the insulating layer of the connection layer has a plurality of through-holes including the through-hole provided therein, the connection layer has a plurality of via-conductors including the via-conductor provided in the plurality of through-holes, and the portion of the upper surface of the connection layer is provided from the side surface of the connection layer to a via-conductor out of the plurality of via-conductors closest to the recess.

4. The three-dimensional circuit board according to claim 1, wherein the via-conductor is made of conductive paste filing the through-hole in the insulating layer.

5. The three-dimensional circuit board according to claim 1, wherein the portion of the upper surface of the connection layer has a curved shape, and the portion of the upper surface of the upper substrate has a curved shape.

6. The three-dimensional circuit board according to claim 1, wherein the upper substrate has a constant thickness throughout the upper surface including the inclining portion of the upper surface of the upper substrate.

7. The three-dimensional circuit board according to claim 1, wherein the inclining portion of the upper surface of the upper substrate is parallel to the inclining portion of the upper surface of the connection layer.

8. The three-dimensional circuit board according to claim 1, wherein the upper substrate and the connection layer has side surfaces facing the recess, and a total thickness at the side surface of the upper substrate and the side surface of the connection layer is smaller than a height of a component accommodated in the recess.

9. The three-dimensional circuit board according to claim 1, wherein no via-conductor is formed in the inclining portion of the upper surface of the upper substrate and the inclining portion of the upper surface of the connection layer.

10. The three-dimensional circuit board according to claim 1, wherein the connection layer includes no core material.

11. The three-dimensional circuit board according to claim 1, wherein the connection layer contains coloring agent.

12. The three-dimensional circuit board according to claim 1 further comprising an insulating coat covering the exposed portion of the upper surface of the lower substrate.

13. The three-dimensional circuit board according to claim 12, wherein the insulating coat contains antistatic agent.

* * * * *